Nov. 25, 1969 MORIO INOUE ET AL 3,480,475

METHOD FOR FORMING ELECTRODE IN SEMICONDUCTOR DEVICES

Filed March 21, 1967

3,480,475

METHOD FOR FORMING ELECTRODE IN SEMICONDUCTOR DEVICES

Morio Inoue and Gota Kano, Suita-shi, and Jinichi Matsuno and Shigetoshi Takayanagi, Kyoto, Japan, assignors to Matsushita Electronics Corporation, Oaza Kadoma, Kadoma-shi, Osaka, Japan, a corporation of Japan Filed Mar. 21, 1967, Ser. No. 624,938
Claims priority, application Japan, Mar. 29, 1966, 41/20,210
Int. Cl. B44d 1/14, 1/20
U.S. Cl. 117—227 1 Claim

ABSTRACT OF THE DISCLOSURE

A method of depositing a molybdenum or tungsten electrode from a halide or carbonyl compound of such metal onto semiconductor substrate having a surface impurity concentration of $10^{18}$ cm.$^{-3}$ or over while it is heated at 500° C. or lower, wherein the depositing operation can be carried out at a low reaction temperature by preheating said halide or carbonyl compound before the halide is subjected to hydrogen reduction or before said carbonyl compound is subjected to thermal decomposition for inducing deposition.

Figure 1:
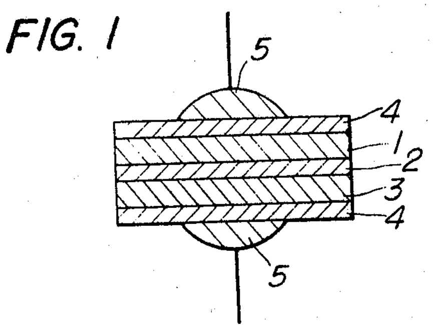

The present invention relates to a novel method for forming such an electrode as is characterized by its being free from developing the so-called "purple plague" which has been regarded as a shortcoming of those prior electrodes formed on semiconductor devices, by chemically depositing a film of metal selected from molybdenum and tungsten on the face of a semiconductor such as silicon, germanium or the like having a surface impurity concentration of $10^{18}$ cm.$^{-3}$ or over.

In the prior practice of forming a lead wire in, for example, a silicon planar transistor, the procedure included the steps of depositing, by vacuum evaporation, a thin film of aluminum or gold on the face of the emitter or the base portion of said transistor, and thereafter forming a gold or aluminum wiring on said thin film by thermo-compression bonding or a like technique. It has been known, however, that in case of the combination of gold and aluminum, there takes place, with the lapse of time, a chemical reaction at the bond between the metal film and the metal wiring during the operation of the device, leading to the formation of a certain kind of intermetallic compound, and that this causes the bonded site to deteriorate either mechanically or electrically, resulting in the developing of the undesirable phenomenon of the so-called purple plague which is represented by the disconnection of said electrode. Based on this finding, there has been employed the electron beam evaporation technique in effecting the deposition of a molybdenum film on the face of a semiconductor. This prior method, however, bears a serious shortcoming in that it requires an expensive apparatus and bears in it a theoretical difficulty in forming a contact which is satisfactory in both the mechanical strength of the bond and ohmic contact.

The present invention has its feature in the feasibility of forming an ohmic contact having an intensive mechanical bonding strength.

Based on a conception completely different from that of those conventional methods as have been described, the present invention is featured in that it forms an ohmic contact having an intensive mechanical bonding strength, by chemically depositing molybdenum or tungsten on the face of a semiconductor such as silicon, germanium or the like, from the reaction as will be hereinafter described.

More specifically, the present invention is characterized by chemically depositing, from vapor phase, a metal selected from molybdenum and tungsten on a substrate such as silicon and germanium held at a temperature under 500° C., by the hydrogen reduction of a halide of such metal or by the thermal decomposition of a carbonyl compound, such, for example, as molybdenum carbonyl $MO(CO)_6$, of said metal.

As has been described in detail in the copending Japanese patent applications Ser. Nos. 49,096/1965 and 77,691/1965, filed by the same applicant, the inventors have developed an invention aimed at providing an ohmic contact by depositing molybdenum or tungsten on a semiconductor substrate held at a temperature above 500° C. and by forming an intermediate phase consisting of the combination of said molybdenum or tungsten and said semiconductor at the interface between said metal and said semiconductor, and another invention contemplating provision of a diode or a transistor by depositing molybdenum or tungsten on a semiconductor substrate held at a temperature of 500° C. or lower, and by forming a Schottky barrier at the interface therebetween. The present invention differs completely from any of these inventions disclosed in the aforesaid copending applications, and contemplates providing an ohmic contact without the presence of an intermediate phase at the interface between molybdenum or tungsten and a semiconductor, by depositing, utilizing the aforesaid technique, molybdenum or tungsten on the semiconductor substrate held at a temperature of 500° C. or lower and having a surface impurity concentration of $10^{18}$ cm.$^{-3}$ or more.

Description will hereinafter be made on an example of the present invention.

First, phosphorous pentoxide was deposited on both sides of an n-type silicon slice having a specific resistance of 70Ω—cm. and a thickness of 200μ in an oxygen atmosphere at 1000° C. Thereafter, this slice was shaved by a thickness of 20μ at one side thereof. Subsequently, boron trioxide suspended in monomethylene-glycol ethyl was applied to the face on the shaved side. The resulting slice was heated at 1280° C. for 24 hours and a p-n junction diode was thus formed. The p-layer and the n-layer thus formed had a surface impurity concentration of $10^{18}$ cm.$^{-3}$ or more.

Figure 2:
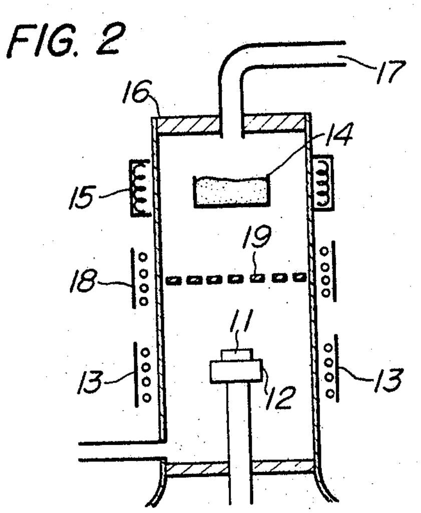

The present invention will be more clearly described by referring to the accompanying drawings which are given by way of example, in which:

FIG. 1 is a cross-sectional view showing the structure of the diode which is necessary for the description of one embodiment of the present invention; and FIG. 2 is a schematic diagram of an apparatus required for the deposition of molybdenum or tungsten on a semiconductor substrate according to the method of the present invention.

In FIG. 1, reference numeral 1 represents a boron-diffused layer and numeral 3 represents a phosphor-diffused layer. Numeral 2 represents a silicon blank of n-type having a specific resistance of 70Ω—cm. Numeral 4 represents a molybdenum film and numeral 5 represents a copper block.

The silicon slice 11 thus formed was placed on the heating pedestal 12 of the apparatus shown in FIG. 2, and was maintained at a temperature in the range of from 400° C. to 500° C. in an RF furnace 13. Concurrently, while a tray 14 containing molybdenum pentachloride ($MoCl_5$) was held at 100° C. by means of a resistance heater 15, hydrogen gas was introduced into the reaction tube 16 from the upper portion thereof at the rate of 1 liter per minute, to thereby form a mixed gas of molybdenum pentachloride and hydrogen gas. This mixed gas was passed therefrom through a mesh-shaped preheater 19 made of carbon and held, by means of an RF furnace, at a temperature ranging from 600° C. to 900° C. so that the gas was blown onto the silicon substrate 11. A molybdenum film was deposited in this manner on said substrate 11. (Though not shown in FIG. 2, numeral 4 in FIG. 1 represents the molybdenum film thus formed.) By a similar procedure, a molybdenum film was deposited also on the other face of the slice.

On this molybdenum film 4 was deposited gold, by vacuum evaporation, and onto said gold film was bonded the copper block 5, with the interposition of a gold foil (not shown because of its minute thickness) therebetween, by thermo-compression at 400° C. Thus the electrical characteristic was measured. The result of this measurement was compared with that of a diode fabricated according to the conventional nickel plating technique but having a structure and being packed in a casing exactly the same as those of the diode of this example, which is shown in the following Table 1.

TABLE 1

| Diode from— | Characteristic of diode Vd (v.) | Jf (a./mm.²) | Kjm (mv.) |
|---|---|---|---|
| Nickel-plating (conventional). | 1.2 | 11.5 | 11.5 |
| Mo-deposition by evaporation (example of the invention). | 1.0 | 14.3 | 10.2 |

In Table 1, Vd represents the terminal voltage when a current of 50 a. is passed in the forward direction of the diode. Jf represents the current density when the terminal voltage is 1 v. Kjm represents the change in the terminal voltage when a pulse of 1 v. and having a width of 0.8 second is applied in the forward direction of the diode while passing a current of 2 ma. in the forward direction of the same.

As is understood also from the above table, there is obtained, in the example embodying the present invention, an ohmic contact which is superior to what has been obtained in the past.

According to the experiment conducted by the inventors, it has been made clear, from the comparison between the convention diode fabricated by bonding, by thermo-compression at 350° C., a gold wiring having a diameter of 25$\mu$ onto the aluminum film having a thickness of 2$\mu$ deposited on silicon at 400° C. and the diode fabricated by bonding, by thermo-compression at 400° C., a gold wiring having a diameter of 25$\mu$ onto the gold deposited by vacuum evaporation at 300° C. on a molybdenum film deposited according to the present invention tion, that in case both diodes were held at 300° C. for a consecutive period of 220 hours, the diode of the prior art showed a reduction in its mechanical strength from its initial range of 8 to 10 down to the range of 2.5 to 3.5 g., while the diode obtained according to the present invention showed that its initial mechanical strength of 8 to 10 g. was retained.

This demonstrates the fact that according to the method of the present invention, the so-called purple plague does not take place as anticipated theoretically.

As has been previously stated, the inventors have developed another invention which is disclosed in the co-pending application and which is summarized that when molybdenum film from molybdenum pentachloride is deposited on a semiconductor substrate by hydrogen reduction, there is produced a Schottky barrier between the deposited metal and the substrate, and that this resulting product can be used as a diode. It is to be noted however, that the phenomenon which takes place in the present invention differs completely from what occurs in said other invention. With respect to this, the following consideration may be made: that is to say, in the event that the surface impurity concentration of a semiconductor is $10^{18}$ cm.$^{-3}$ or over, as is seen in the present invention, the thickness of the Schottky barrier formed between the metal and the semiconductor is so sufficiently thin as can be trespassed by electrons due to tunnel effect, and accordingly this barrier will no longer act as a rectifier; as a result, the product of the present invention shows an excellent characteristic of an ohmic contact, as shown in Table 1.

As has been also stated previously with respect to still another invention of the inventors, which is disclosed in still another co-pending application, the inventors have found still another phenomenon. That is, an ohmic contact is obtained from several intermediate phases which develop between molybdenum and a semiconductor substrate in case the substrate temperature is elevated above 500° C. It is also to be noted that the present invention differs also from said finding, since this present invention is featured in that an ohmic contact can be obtained at the temperature of 500° C. or lower and that an ohmic contact is obtained without being due to the presence of such intermediate phases.

According to the research conducted by the inventors, it has been found that the aforesaid excellent result obtained according to the present invention is not caused solely by the hydrogen reduction of a halide of molybdenum, but a similar result can be obtained also from the thermal decomposition of molybdenum carbonyl, the hydrogen reduction of a halide of tungsten and the thermal decomposition of tungsten carbonyl.

It is also to be understood that the present invention is effectively applied not only to silicon as a semiconductor, but also as equally effectively applied to other semiconductors such as germanium and gallium arsenide.

What is claimed is:

1. A method for forming an electrode in semiconductor devices, characterized by depositing a film of metal selected from molybdenum and tungsten on a semiconductor substrate having a surface impurity concentration of no smaller than $10^{18}$ cm.$^{-3}$ and being held at 500° C. or lower, by the hydrogen reduction of a halide of said metal or by the thermal decomposition of a carbonyl compound selected from molybdenum carbonyl and tungsten carbonyl.

References Cited

UNITED STATES PATENTS

| | | | |
|---|---|---|---|
| 2,973,466 | 2/1961 | Atalla et al. | 317—234 X |
| 3,406,050 | 10/1968 | Shortes | 148—179 |

WILLIAM L. JARVIS, Primary Examiner

U.S. Cl. X.R.

29—569; 117—217, 107.2, 212; 148—174; 317—5, 5.3